United States Patent [19]
Merrill et al.

[11] Patent Number: 5,844,299
[45] Date of Patent: *Dec. 1, 1998

[54] INTEGRATED INDUCTOR

[75] Inventors: Richard Billings Merrill, Woodside; Donald M. Archer, Santa Clara, both of Calif.

[73] Assignee: National Semiconductor Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 791,987

[22] Filed: Jan. 31, 1997

[51] Int. Cl.⁶ .................................................. H01L 29/00
[52] U.S. Cl. ........................................... 257/531; 257/622
[58] Field of Search .................... 257/418, 419, 257/531, 622

[56] References Cited

U.S. PATENT DOCUMENTS

| | | | |
|---|---|---|---|
| 4,472,239 | 9/1984 | Johnson et al. | 257/622 |
| 4,478,077 | 10/1984 | Bohrer et al. | 257/622 |
| 4,587,105 | 5/1986 | Bonne et al. | 257/419 |
| 4,682,503 | 7/1987 | Higashi et al. | 257/419 |
| 5,370,766 | 12/1994 | Desaigoudar et al. | 156/643 |
| 5,416,356 | 5/1995 | Staudinger et al. | 257/531 |
| 5,446,311 | 8/1995 | Ewen et al. | 257/531 |
| 5,450,263 | 9/1995 | Desaigoudar et al. | 360/110 |
| 5,481,131 | 1/1996 | Staudinger et al. | 257/531 |
| 5,497,337 | 3/1996 | Ponnapalli et al. | 364/489 |
| 5,539,241 | 7/1996 | Abidi et al. | 257/531 |
| 5,600,174 | 2/1997 | Reay et al. | 257/622 |

FOREIGN PATENT DOCUMENTS

| | | |
|---|---|---|
| 5335487 | 12/1973 | Japan . |
| 63-240560 | 6/1988 | Japan . |
| 2072660 | 3/1990 | Japan . |
| 31788158 | 8/1991 | Japan . |
| 3198373 | 8/1991 | Japan . |
| 405090616 | 4/1993 | Japan ..................................... 257/419 |

OTHER PUBLICATIONS

Chang et al., Large Suspended Inductors on Silicon and Their Use in a 2 Micron CMOS RF Amplifier, IEEE Electron Device Letters, vol. 14, No. 5, pp. 246–248, May 1993.

J.Y.–C. Chang, et al., "Large Suspended Inductors on Silicon and Their Use in a 2–μ COMOS RF Amplifier", IEEE Electronics Device Letters, vol. 14, No. 5, May 1993, pp. 246–248.

R.B. Merrill, et al., "Optimization of High Q Inductors for Multi–Level Metal CMOS", IEDM 95–983, pp. 38.7.1–38.7.4.

Ahmadreza Rofougaran, et al., "A 1 GHz CMOS RF Front–End IC for a Direct–Conversion Wireless Receiver", IEEE Journal of Solid State Circuits, vol. 31, No. 7, Jul. 1996, pp. 880–89.

*Primary Examiner*—Ngân Van Ngô
*Attorney, Agent, or Firm*—Kyla L. Harriel

[57] ABSTRACT

An integrated inductor with filled etch includes a substrate of semiconductor material which includes a surface and a cavity disposed therein, a mass of dielectric material disposed within the cavity, a layer of dielectric material disposed upon the mass of dielectric material, and a patterned layer of conductive material disposed upon the layer of dielectric material, such that the integrated inductor is formed without an oxide bridge. Thus, the integrated inductor has a rugged architecture.

11 Claims, 4 Drawing Sheets

INTEGRATED INDUCTOR

BACKGROUND OF THE INVENTION

1. Technical Field of the Invention

The present invention relates to the field of integrated circuits (ICs) used in radio frequency (RF) and microwave circuits, and in particular, to the construction and integration of inductors within such ICs.

2. Description of the Related Art

Electrical systems are made up of various components, including active elements such as transistors, and passive elements such as inductors, capacitors, and resistors.

One common electrical system is a phase-locked loop (PLL). A PLL is a frequency-selective system that uses feedback to maintain an output signal in a specific phase relationship with a reference signal. Monolithic PLLs are used in many areas of electronics to control the frequency and/or phase of a signal. These applications include FM detectors, frequency synthesizers, and analog and digital modulators and demodulators. FIG. 1 shows the block diagram of a basic phase-locked loop system 100 which comprises a phase detector 101, a voltage-controlled oscillator (VCO) 103, and a loop filter 105. The PLL 100 operates such that the phase detector 101 compares two input frequencies, $f_{in}$ and $f_{vco}$, and generates an output that is proportional to their phase difference. If the two input frequencies are not equal, the VCO 103 generates an output signal which shifts in frequency in the direction of $f_{in}$. If the input frequencies are equal, then the VCO "locks" to the input frequency maintaining a fixed phase relationship with the input signal. The loop filter 105 controls the PLL dynamics and therefore the performance of the system.

A key component of the PLL is the voltage controlled oscillator (VCO) which tracks the incoming signal or extracts information from it. An important design aspect of the VCO is the noise content of the output signal. The dominant resultant noise will appear as phase noise (jitter) on the output signal from the VCO. Due to the dynamics of the PLL some of the sources of noise will be filtered by the loop functions that have either a low-pass characteristic or a high-pass characteristic. Typically it will be found that one particular noise source will be dominant and the PLL performance can then be adjusted to minimize the output noise.

A PLL is frequently used to enhance the noise performance of an oscillator by taking advantage of these noise-filtering properties. For example, a crystal oscillator typically has very good low frequency noise characteristics and integrated inductive-capacitive (LC) oscillators can substantially reduce phase jitter of a complementary metal oxide semiconductor (CMOS) IC VCO. Indeed this integrated LC oscillator is desirable because it operates at the limits of CMOS performance levels, and because feedback techniques typically are not fast enough.

The problem with the conventional integrated LC oscillators is that power levels are too high due to current shoot-through in the inductor which results from a very low inductance quality value, Q. Additionally, the temperature dependence of the oscillation frequency is too great for practical operation of the integrated LC oscillator in VCO designs.

These intrinsic problems stem from the interaction of the inductor with the substrate on the wafer. The substrate absorbs a significant amount of RF energy radiated from the inductor which reduces the inductance quality value, Q. Additionally, the self-resonance caused by the parasitic capacitance of the inductors to the substrate reduces the maximum effective operating frequency, Fmax. Each of these effects decreases the overall performance of an integrated LC oscillator.

These problems caused by the interaction with a substrate can be overcome by making the area under the inductor appear locally insulating. By etching out the substrate from under the inductor such that the inductor is encased in a suspended oxide layer attached to the rest of the silicon wafer, the interaction between the inductor and the substrate is minimized. This technique of suspending the inductor in the air over the etch pit, is further explained in *Large Suspended Inductors on Silicon and Their Use in a 2-um CMOS RF Amplifier*, IEEE Electron Device Letters, Vol. 14, No. 5, May 1993, pp.246–48, and *A 1 GHz CMOS RF Front-End IC for a Direct-Conversion Wireless Receiver*, IEEE Journal of Solid-State Circuits, Vol. 31, No. 7, July 1996, pp. 880–89, both of which are incorporated herein by reference.

Such a suspended inductor technique does permit wholly-integrated RF components in CMOS circuits. Thus, the suspended inductor is useful as a local oscillator, a low-noise-amplifier, a power amplifier, and even as a low quality bandpass filter. However, since the wafer on which the suspended inductor is fabricated is very fragile, it easily susceptible to breaking. Due to this susceptibility, the suspended inductor is not a robust architecture for the typical plastic package assembly process. Thus, a need exists to achieve performance equivalent to that of a suspended inductor, while simultaneously achieving a more rugged structure.

SUMMARY OF INVENTION

An integrated inductor fabricated on a wafer and having a robust architecture is achieved by etching the surface of the substrate and filling it with a crystallized oxide. A layer of masking material is formed on the surface of the substrate in a pattern to expose portions of the substrate. The exposed portions of the substrate are then etched to form a pit. The pit will etch in a pyramidal shape. An oxide layer is then deposited on the etched substrate. A high temperature reflow will then solidify the oxide to near that of crystalline silicon dioxide. The wafer is lapped back to form a planar surface for subsequent processing. At this point, the standard CMOS fabrication process sequence resumes and the inductor is formed with its normal interconnects. An inductor having a rugged architecture is therefore constructed.

These and other features and advantages of the present invention will be understood upon consideration of the following detailed description of the invention and the accompanying drawings.

BRIEF DESCRIPTION OF THE DRAWINGS

Like reference symbols are employed in the drawings and in the description of the preferred embodiments to represent the same or similar items.

DETAILED DESCRIPTION OF THE PREFERRED EMBODIMENT

The fabrication process of a monolithic integrated circuit involves a sequence of processing steps. FIGS. 2a–2f show cross sectional views illustrating the process fabrication sequence of an integrated inductor fabricated in accordance with one embodiment of this invention.

Figure 1:
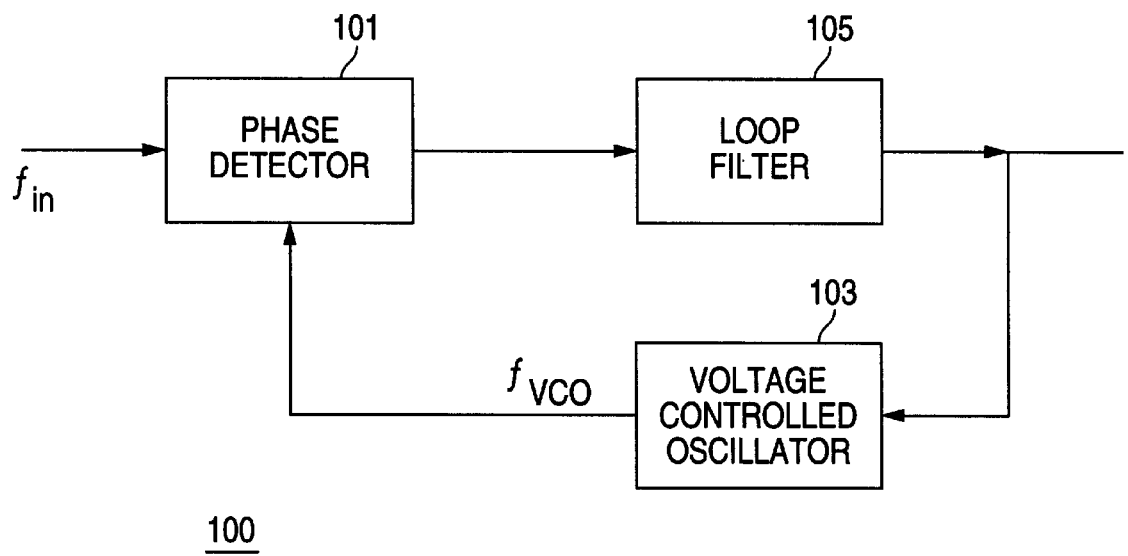
FIG. 1 shows a conventional phase-locked loop system.
Figure 2A:
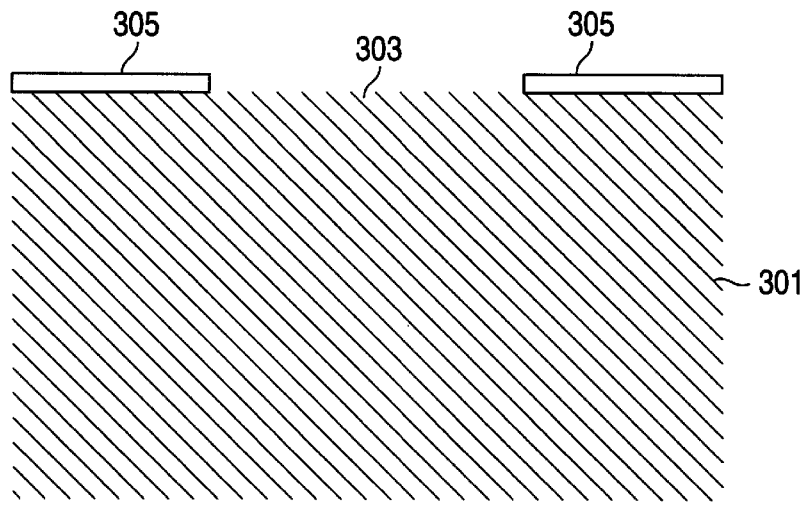
FIGS. 2a–2f illustrate the cross-sectional views of the fabrication steps of an inductor in accordance with the present invention.

Referring to FIG. 2a, an oxide mask 305, which is above a substrate 301, is defined under the center of the area where the inductor will be formed. In this embodiment, substrate 301 is doped type-N silicon. Although type-N doping is used, it will be appreciated that when a semiconductor material is used as substrate 301, either P or N conductivity type is suitable, as well as any convenient doping level. Additionally, the substrate 301 is consistent with typical silicon semiconductor substrates, although other silicon crystal orientations are suitable for use as substrate 301.

Figure 2B:
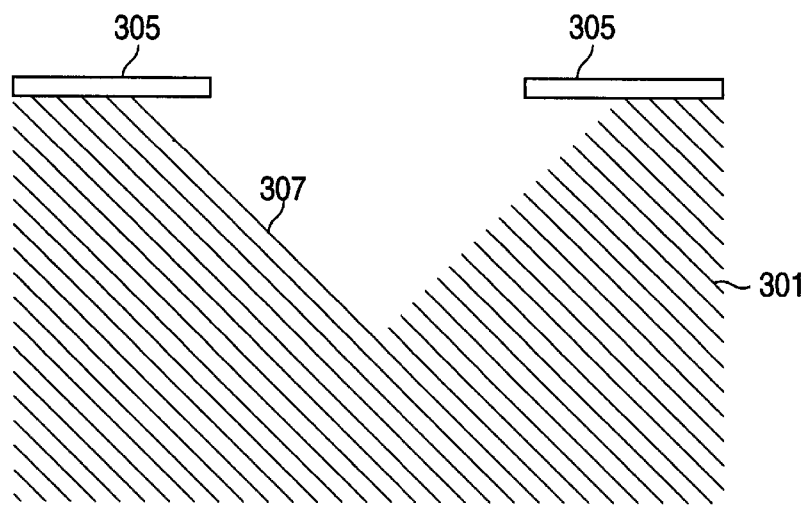
Figure 3A:
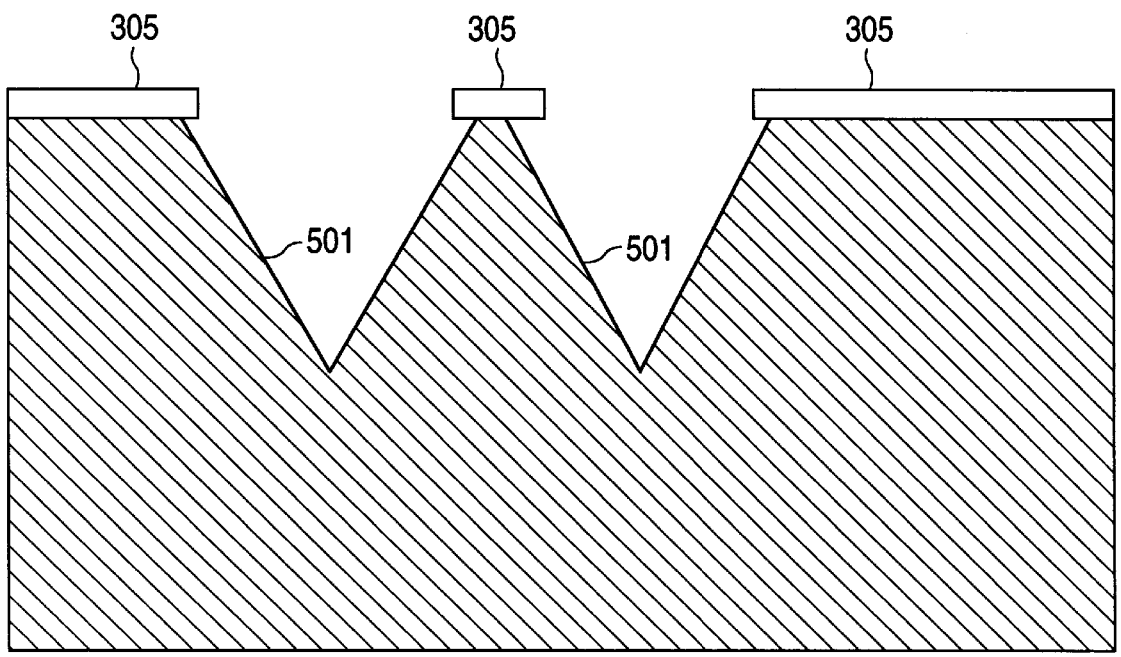
FIGS. 3a and 3b illustrate the cross-sectional views of the fabrication steps of an inductor in accordance with an alternate embodiment of the present invention.
Figure 3B:
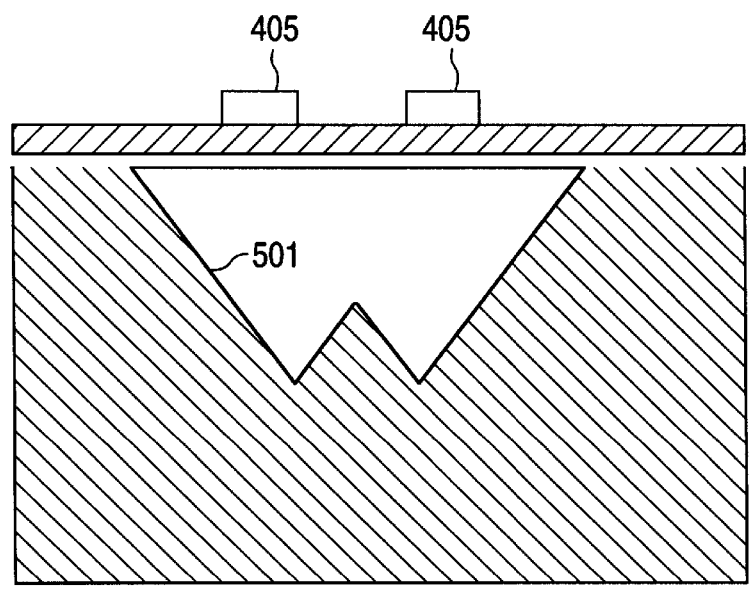

Referring to FIG. 2b, the exposed silicon surface 303 is then etched using a silicon etchant such as potassium hydroxide (KOH). The etchant used in this step etches away the exposed silicon anisotropically such that the etching results in the formation of a pyramid-shaped isolation pit 307 on the wafer surface. It would be ideal to etch a rectangular pit, however, the etching processes are incapable of precisely transferring the pattern established by the protective mask. As a result, some of the silicon material under the mask is etched as well causing an effect known in the art as undercutting. It is desirable to form this etch pit as a large cavity to minimize radiative loss into the substrate, but consideration must also be taken of the effect the depth of the etch pit has on the strength of the wafer. In a preferred embodiment, the depth of the pit 307 is approximately 100 microns, representing only one-eighth of the thickness of an 8-inch diameter wafer. In another preferred embodiment, as shown in FIG. 3a, a selective wet etch is used to etch the substrate to form a W-shaped pit 501. This etch pit configuration enables the interconnects of the inductor to be formed over the deepest areas of the etch pit thereby limiting radiation loss into the substrate, as shown in FIG. 3b.

Figure 2C:
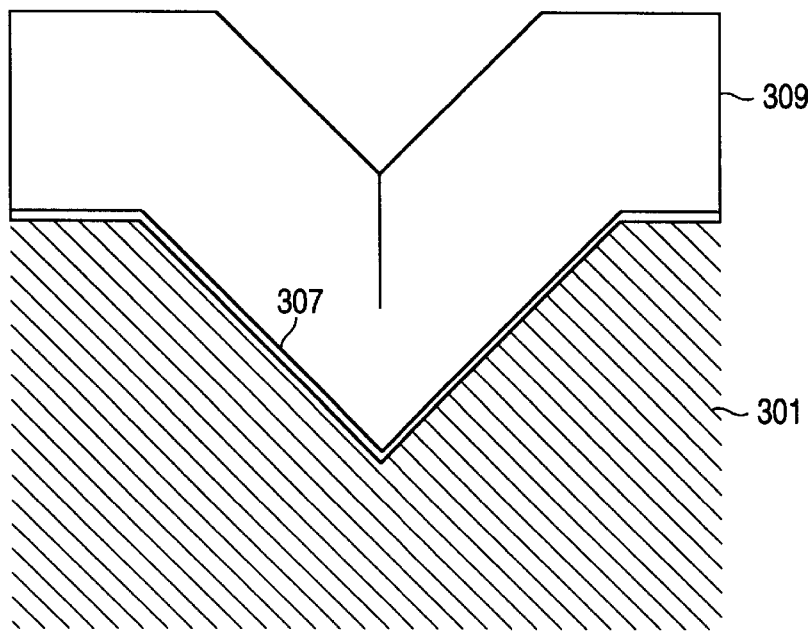

A layer of dielectric material 309 is then grown or deposited on the surface of the substrate 301 and pit 307, as shown in FIG. 2c. In a preferred embodiment, dielectric layer 309 is a silicon dioxide layer doped with either phosphorous or boron (or both). Introducing these dopants into the crystal controls the resistivity level of the semiconductor device and facilitates reflow which is described below in a subsequent step. Additionally, when phosphorous is used as the dopant, it increases the moisture-barrier property of the silicon dioxide, or glass. This facilitates gettering whereby mobile ionic contaminants become attached to the dopant which prevents their movement into other areas of the wafer. Since contamination can cause pitted layers in the wafer, affect the cleanliness of the wafer surface, and alter the dimensions of the electronic device, introducing the dopants into the crystal greatly improves processing of the device.

The oxide layer 309 also promotes adhesion of a thick oxide layer to be deposited in a subsequent step, and passivates the surface of the substrate 301. By passivating the surface of the substrate 301, the oxide layer 309 protects the silicon substrate 301 from external contamination, provides a barrier to the diffusion of impurities into the silicon, and provides an insulation surface over which the metal interconnections can be formed.

Figure 2D:
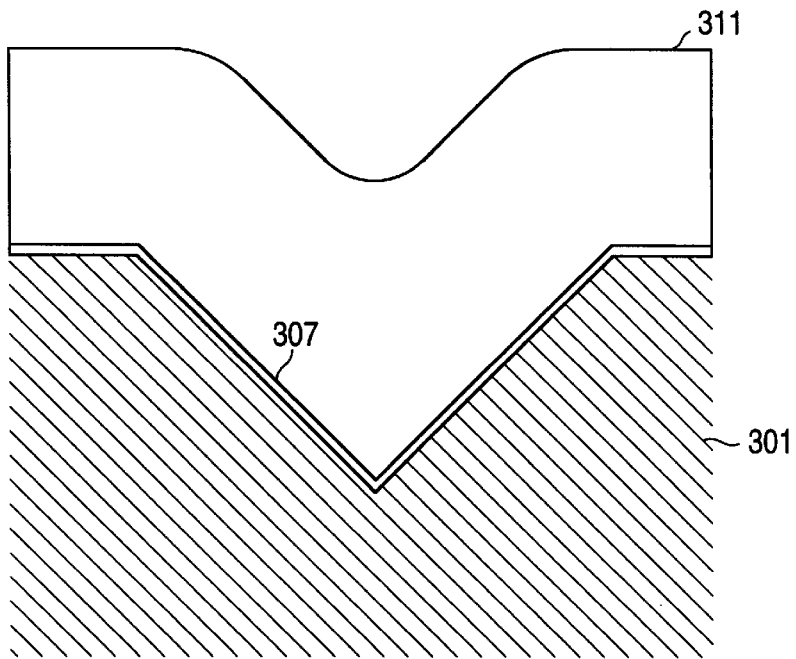

Next, as shown in FIG. 2d, a high temperature reflow solidifies the oxide layer 309 to approximately that of crystalline silicon dioxide, $SiO_2$, forming a solid layer 311. This reflow causes the silicon dioxide to flow at a relatively low temperature, which aids the planarization of the wafer surface after a heating step. This enables the electronic device to have a hard planarized layer.

Figure 2E:
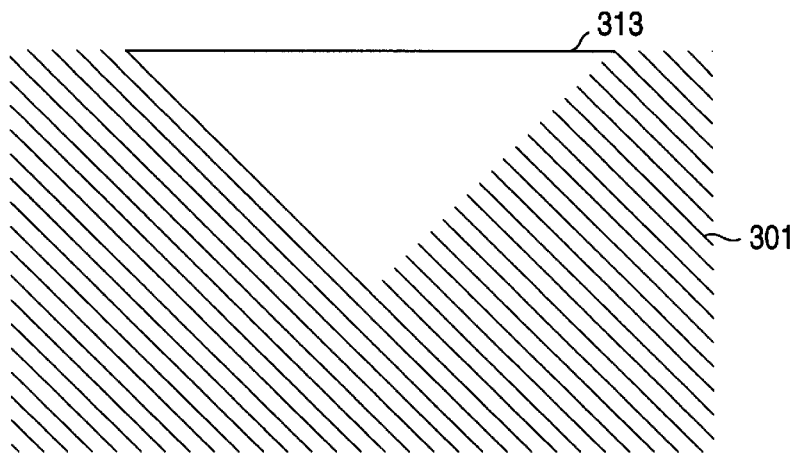
Figure 2F:
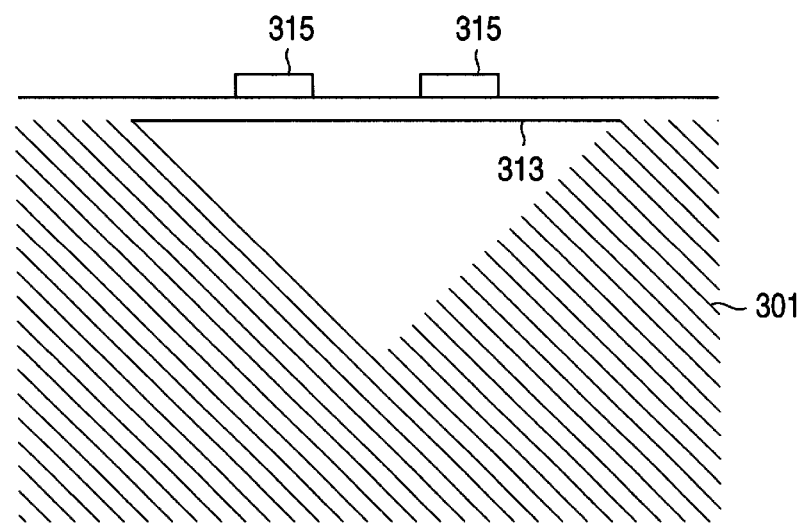

Referring to FIG. 2e, after the reflow, the wafer 300 is lapped back to form a hard, smooth and flat planar surface 313 for subsequent processing. Control of the lapping operation is not critical since the pit is usually about 100 microns deep. At this point, the typical CMOS process sequence resumes so that the inductor is formed with interconnects 315 as shown in FIG. 2f.

Providing an etch pit filled with crystallized oxide provides for a sturdy electronic device. This design is in contrast to the conventional suspended inductor design, whereby the suspended inductor is attached to the rest of the CMOS substrate by oxide "bridges" and is susceptible to breakage during the standard package assembly process. By fabricating the inductor such that it is lays flush against a planar surface, the inductor can withstand more mishandling during the packaging process than the conventional integrated inductor design. The interconnect pattern 405 is patterned such that as much of the inductor is formed over the etch pit resulting in a minimization of radiative loss to the substrate. Centering the interconnect pattern 405 over the etch pit typically provides the most favorable result. In an another embodiment, shown in FIG. 3b, when the W-shaped pit 501 is etched, the interconnect pattern 405 can be centered over the deepest areas of the etch pit.

The inductor fabrication technique in accordance with the present invention also takes into consideration two key areas of concern during the fabrication process. Since various techniques are performed on the relatively delicate wafers, breakage of the wafer is a key concern. The heat treatments included in the above process increase the susceptibility of wafers to breaking. Since wafers are crystalline structures, any strains caused by high temperature processing can cause breakage in a subsequent process, rendering the wafer unacceptable. Additionally, since wafer surfaces must remain flat throughout the processing, warping of the wafer surface is another key concern. Warping is typically caused by rapid heating and/or cooling of the wafer surface. It is a particular concern when the fabrication process includes projection patterning techniques, which project the pattern to be etched onto the wafer surface, such as that indicated in the above process. When the wafer is warped, the image projected will be distorted which results in the image having inaccurate dimensions on the wafer. The present invention addresses both the warping and breakage concerns. Since less than one-hundredth (1/100) of the wafer surface is covered in a typical process application, the strength of the wafer is not greatly affected, therefore alleviating concerns about warping and breaking.

A combination of various individual process steps from the various embodiments described above are suitable for use to fabricate the individual layers to achieve a structure of this invention.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. An apparatus including an integrated patterned mass of conductive material useful for fabricating an integrated inductor, comprising:

a substrate of semiconductor material which includes a surface and a cavity disposed therein;

a mass of dielectric material disposed within said cavity; and a patterned layer of conductive material disposed upon said mass of dielectric material, such that said integrated inductor is formed without suspension, wherein said substrate of semiconductor material has a thickness;

said cavity has a depth; and said depth of said cavity is less than said thickness of said substrate.

2. The apparatus of claim 1, wherein said cavity is approximately pyramidal in shape.

3. The apparatus of claim 1, wherein said mass of dielectric material comprises a mass of oxide material.

4. The apparatus of claim 3, wherein said mass of oxide material comprises a mass of doped oxide material.

5. The apparatus of claim 1, wherein:

said depth of said cavity is approximately one-eighth of said thickness of said substrate.

6. An apparatus including an integrated patterned mass of conductive material useful for fabricating an integrated inductor, comprising:

a substrate of semiconductor material which includes a surface and a cavity disposed therein;

a mass of dielectric material disposed within said cavity;

a layer of dielectric material disposed upon said mass of dielectric material; and a patterned layer of conductive material disposed upon said layer of dielectric material, such that said integrated inductor is formed without a support bridge, wherein said substrate of semiconductor material has a thickness;

said cavity has a depth; and said depth of said cavity is less than said thickness of said substrate.

7. The apparatus of claim 6, wherein said cavity is approximately pyramidal in shape.

8. The apparatus of claim 6, wherein said mass of dielectric material comprises a mass of oxide material.

9. The apparatus of claim 8, wherein said mass of oxide material comprises a mass of doped oxide material.

10. The apparatus of claim 6, wherein:

said depth of said cavity is substantially less than said thickness of said substrate.

11. An apparatus including an integrated patterned mass of conductive material useful for fabricating an integrated inductor, consisting of:

a substrate of semiconductor material which includes a surface and a cavity disposed therein;

a mass of dielectric material disposed within said cavity; and a patterned layer of conductive material disposed upon said mass of dielectric material, such that said integrated inductor is formed without suspension or a support bridge, wherein said substrate of semiconductor material has a thickness, said cavity has a depth, and said depth of said cavity is less than said thickness of said substrate.

* * * * *